(12) United States Patent
Kim et al.

(10) Patent No.: US 8,332,575 B2
(45) Date of Patent: Dec. 11, 2012

(54) DATA MANAGEMENT SYSTEMS, METHODS AND COMPUTER PROGRAM PRODUCTS USING A PHASE-CHANGE RANDOM ACCESS MEMORY FOR SELECTIVE DATA MAINTENANCE

(75) Inventors: Jin-Kyu Kim, Seoul (KR); Kyoung-Il Bang, Gyeonggi-do (KR); Hyung-Gyu Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 964 days.

(21) Appl. No.: 12/142,093

(22) Filed: Jun. 19, 2008

(65) Prior Publication Data

US 2008/0320210 A1   Dec. 25, 2008

Related U.S. Application Data

(60) Provisional application No. 60/945,128, filed on Jun. 20, 2007.

(30) Foreign Application Priority Data

Oct. 16, 2007  (KR) .......................... 10-2007-0104215

(51) Int. Cl.
*G06F 12/04* (2006.01)
(52) U.S. Cl. .......... 711/103; 711/E12.008; 711/E12.015
(58) Field of Classification Search .................. 711/103, 711/E12.007, E12.008, E21.015
See application file for complete search history.

(56) References Cited

U.S. PATENT DOCUMENTS

| | | | |
|---|---|---|---|
| 2005/0177687 A1* | 8/2005 | Rao | 711/118 |
| 2006/0106969 A1* | 5/2006 | Hoogerbrugge | 711/1 |
| 2007/0043900 A1* | 2/2007 | Yun | 711/103 |
| 2007/0143559 A1* | 6/2007 | Yagawa | 711/170 |
| 2008/0056022 A1* | 3/2008 | Pawlowski et al. | 365/189.07 |
| 2008/0077756 A1* | 3/2008 | Shibata | 711/156 |
| 2008/0126712 A1* | 5/2008 | Mizushima | 711/141 |
| 2010/0114829 A1* | 5/2010 | Prahlad et al. | 707/640 |

* cited by examiner

*Primary Examiner* — Hal Schnee
(74) *Attorney, Agent, or Firm* — Myers Bigel Sibley & Sajovec, P.A.

(57) ABSTRACT

A data management system includes a data processor configured to provide a file system module configured to store first data in a flash memory in block units and a filter layer module configured to receive second data from the file system module and to store the second data in a phase-change random access memory (PRAM) in sub-block units. The filter layer module may be configured to identify difference data in the second data received from the file system module by comparing the received second data and third data stored in the PRAM, and to write the identified difference data to the PRAM. The second data may include file metadata and the first data may include data other than file metadata. The sub-block units may be byte units.

12 Claims, 7 Drawing Sheets

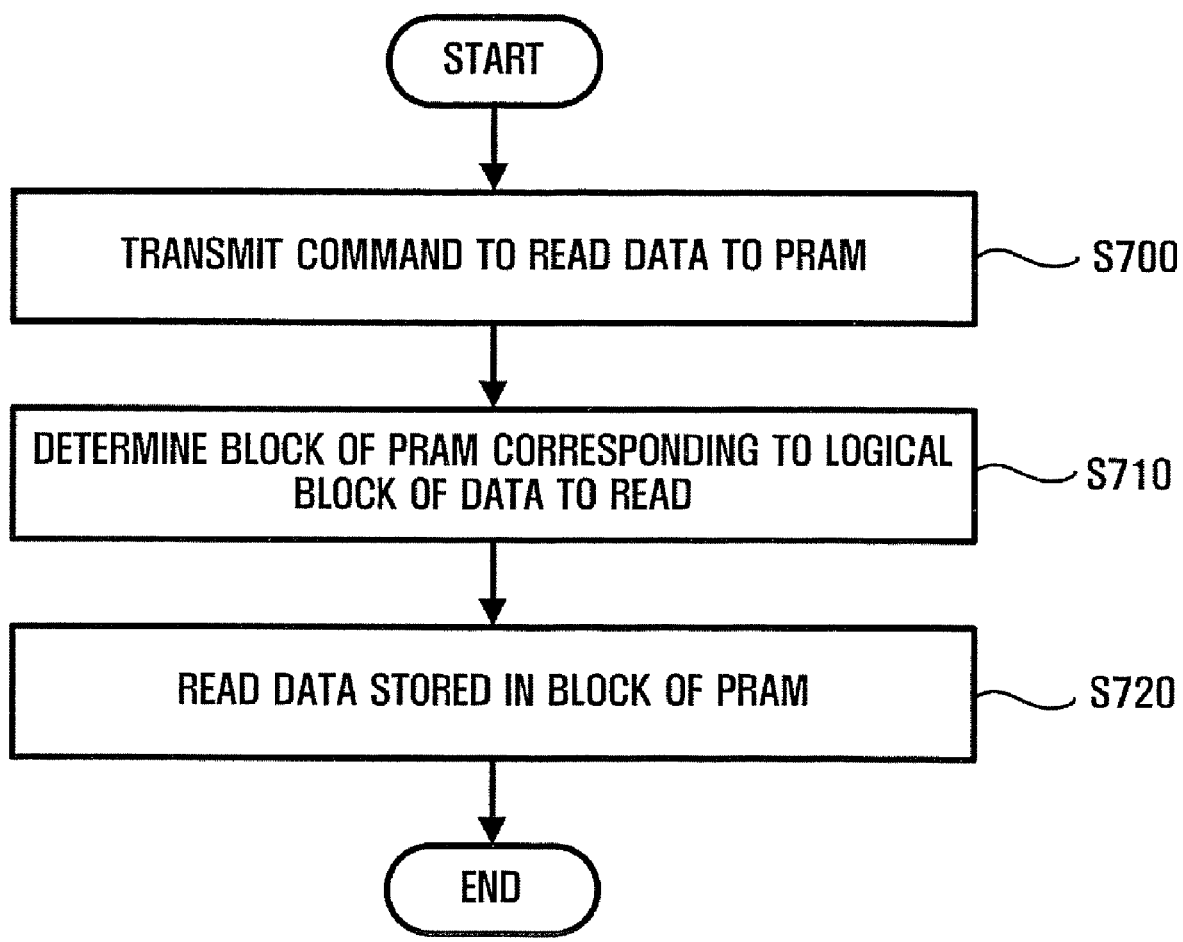

DATA MANAGEMENT SYSTEMS, METHODS AND COMPUTER PROGRAM PRODUCTS USING A PHASE-CHANGE RANDOM ACCESS MEMORY FOR SELECTIVE DATA MAINTENANCE

REFERENCE TO PRIORITY APPLICATIONS

This application claims priority from U.S. Provisional Patent Application 60/945,128 filed on Jun. 20, 2007 in the United States Patent and Trademark Office, and Korean Patent Application No. 10-2007-0104215 filed on Oct. 16, 2007 in the Korean Intellectual Property Office, the disclosures of which are hereby incorporated herein by reference in their entirety.

FIELD OF THE INVENTION

The present invention relates to data management systems, methods and computer program products, and data management system, methods and computer program products using phase-change random access memory (PRAM).

BACKGROUND OF THE INVENTION

Recently, portable digital devices, such as digital cameras, motion picture experts group (MPEG) layer 3 (MP3) players, mobile phones and personal data assistants (PDAs), have come into wide use. In these digital devices, flash memories that can store a large amount of data are typically used.

Flash memories generally are low-power consuming, non-volatile, physically stable, portable and capable of high performance. Due to these characteristics, flash memories are widely used as storage media in portable digital devices. For example, as the capacity of flash memories increases, disks are being replaced by the flash memories.

However, typical conventional flash memories do not support byte-based random access in the manner supported by memories such as static random access memories (SRAMs), dynamic random access memories (DRAMs), phase-change random access memories (PRAMs), magnetoresistive random access memories (MRAMs), and ferroelectric random access memories (FeRAM). Instead, flash memories typical read data in units of pages.

Because of their physical characteristics, flash memories typically perform erase-before-write operations. That is, before a sector of a flash memory is written, a block to which the sector belongs is erased first. Therefore, flash memories may require a longer input/output time than hard disks, which can overwrite sectors.

If the number of times a block of a typically conventional flash memory is erased approaches about 100,000, the probability that memory devices on the block will have failures may significantly increase. Due to such characteristics, when a specific sector of a flash memory is to be written, a typical memory controller searches for a vacant region in a currently allocated block or allocates a block that has been subject to fewer erasures and performs a write operation on the vacant region or the allocated block. Typically, this operation is controlled by a flash translation layer (FTL), which maps a logical sector address of a file system to a physical sector address of a flash memory.

The performance of a flash memory typically depends on an access pattern and an FTL algorithm of a file system that uses a FTL. That is, as the number of random accesses to a file system increases, the overhead of the FTL generally increases, which, in turn, may degrade the performance of a flash memory and increase the number of write/erase cycles. Consequently, the life of the flash memory may be quickly reduced.

The workload of a file system may largely be divided into access for processing user data of the file system and an access for processing metadata of the file system. Changes in the metadata of the file system may cause frequent random accesses to the flash memory.

However, for an FTL algorithm and a flash memory that perform write operations in units of blocks, even if there is only a minor change in user data or metadata, a rewrite operation typically is performed in units of blocks. Because more data than actually needs to be rewritten tends to be rewritten, a device may become overloaded.

As a temporary expedient to solve this problem, a file system, which supports block-based input/output, may be changed to support byte-based input/output. This change may require the file system to be significantly changed.

SUMMARY OF THE INVENTION

Some embodiments of the present invention provide a data management system including a data processor configured to provide a file system module configured to store first data in a flash memory in block units and a filter layer module configured to receive second data from the file system module and to store the second data in a phase-change random access memory (PRAM) in sub-block units. The filter layer module may be configured to identify difference data in the second data received from the file system module by comparing the received second data and third data stored in the PRAM, and to write the identified difference data to the PRAM. The second data may include file metadata and the first data may include data other than file metadata. The sub-block units may be byte units.

In further embodiments of the present invention, a data management system includes a data processor configured to provide a file system module configured to transfer data in block units and a filter layer module configured to receive a block of data from the file system module, to identify changed data in the received block by comparison to a block of data stored in PRAM and to store the identified changed data in the PRAM. The filter layer module may be configured to store the identified changed data in the PRAM in sub-block units. The sub-block units may be byte units.

Additional embodiments of the present invention provide data management methods in which a block of data to be written to a block defined in a file system is received and compared to a block of data stored in a PRAM to identify changed data in the received block of data, followed by storing the changed data in the PRAM. Storing the changed data in the PRAM may include storing the changed data in the PRAM in the sub-block units. The sub-block units may be byte units.

Further embodiments of the present invention provide data management methods in which first data defined in a file system is stored in a flash memory in block units and second data defined in the file system is stored in a PRAM in sub-block units. The second data may be stored in the PRAM by comparing a block of the second data to a block of third data stored in the PRAM to identify changed data in the block of second data and storing the identified changed data in the PRAM. The second data may include file metadata and the first data may include data other than file metadata.

Aspects of the present invention provide a system and method for recording data in sub-block units, which are smaller units than block units, in a device that supports block-based data input/output.

Aspects of the present invention also provide a system and method for writing data in sub-block units in a device, which supports block-based data input/output, by using a phase-change random access memory (PRAM) and without modifying a file system.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a data management system using a PRAM in a block-based input/output device. The data management system includes a file system managing input/output of data in block units; a flash memory writing first data of the data in the block units; the PRAM writing second data of the data in sub-block units; and a filter layer receiving a command from the file system to write the second data to a specific block of the PRAM and writing the difference between the second data and third data stored in the block of the PRAM to the block of the PRAM in the sub-block units.

According to another aspect of the present invention, there is provided a data management system using a PRAM in a block-based input/output device. The data management system includes a file system managing input/output of data in block units; the PRAM writing the data; and a filter layer receiving a command from the file system to write first data to a specific block of the PRAM and transmitting a command to the PRAM to write changed data, which corresponds to the difference between the first data and second data stored in the block of the PRAM, to the block of the PRAM in sub-block units.

According to another aspect of the present invention, there is provided a data management method using a PRAM in a block-based input/output device. The data management method includes receiving a command from a file system to write first data to a specific block of the PRAM; detecting changed data which corresponds to the difference between the first data and second data stored in the block of the PRAM; and writing the changed data to the block of the PRAM in sub-block units.

According to another aspect of the present invention, there is provided a data management method using a PRAM in a block-based input/output device. The data management method includes receiving a command from a file system to write first data to a specific block of the PRAM; reading second data from the block of the PRAM in block units; detecting changed data by comparing the first data and the second data; and writing the changed data to a sub-block in the block of the PRAM in which the changed data is located.

BRIEF DESCRIPTION OF THE DRAWINGS

The above and other aspects and features of the present invention will become more apparent by describing in detail embodiments thereof with reference to the attached drawings, in which:

FIG. 7 is a flowchart illustrating data management operations using a PRAM in a block-based input/output device according to additional embodiments of the present invention.

DETAILED DESCRIPTION OF EMBODIMENTS OF THE INVENTION

Figure 1:
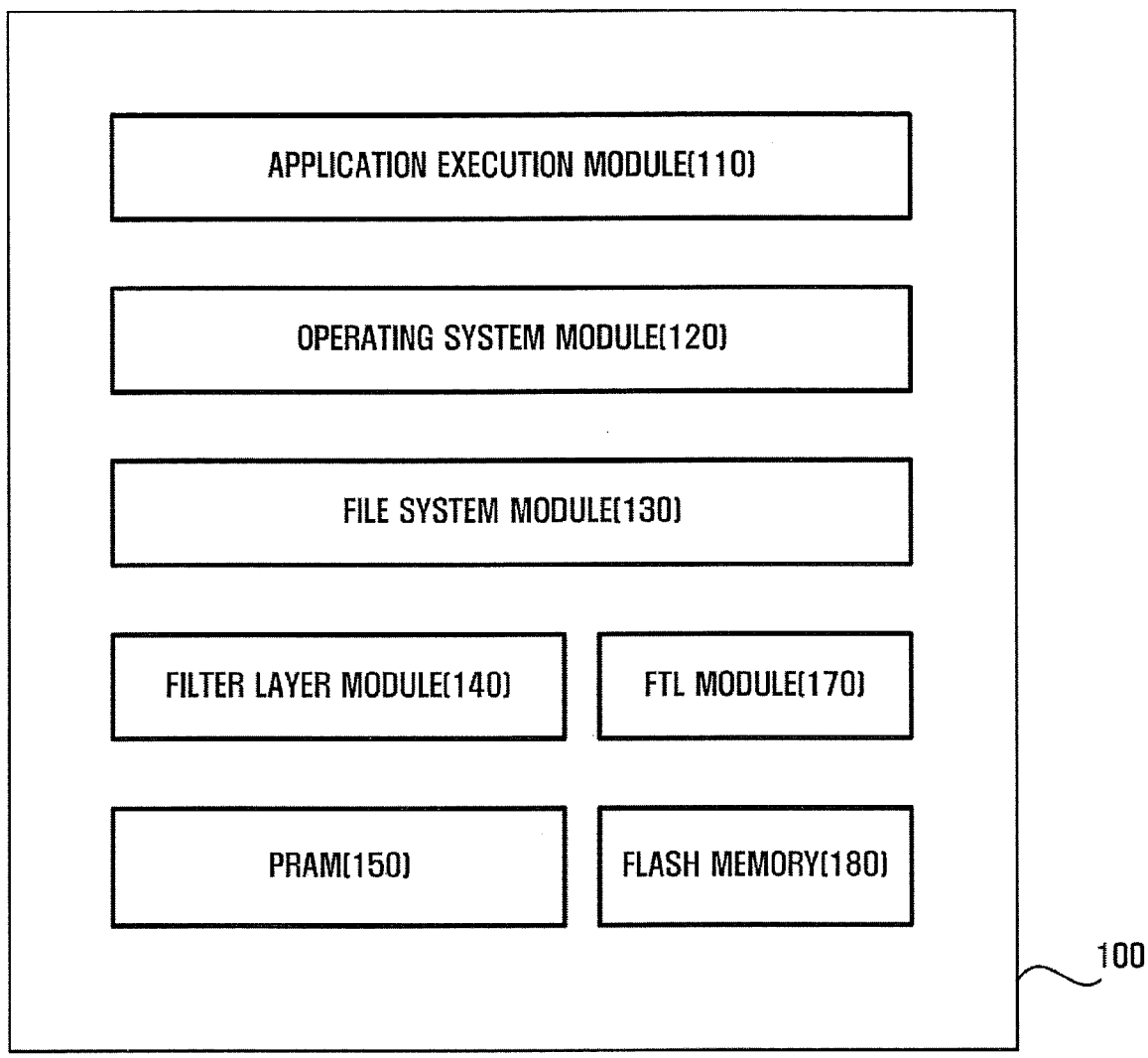
FIG. 1 is a block diagram of a data management system using a phase-change random access memory (PRAM) in a block-based input/output device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

As used herein, the term "and/or" includes any and all combinations of one or more of the associated listed items. It will be understood that when an element and/or component is referred to as being "connected to" and/or "coupled to" another element and/or component, the element and/or component may be directly connected and/or coupled to the other element and/or component, or intervening elements and/or components may be present. In contrast, when an element and/or component is referred to as being "directly connected to" and/or "directly coupled to" another element and/or component, no intervening elements and/or components are present.

It will also be understood that, although the terms "first," "second," etc., may be used herein to describe various elements and/or components, these elements and/or components should not be limited by these terms. Rather, these terms are used merely as a convenience to distinguish one element and/or component from another element and/or component. For example, a first element and/or component could be termed a second element and/or component without departing from the teachings of the present invention.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, some embodiments of the present invention will be described with reference to block diagrams or flowchart illustrations. It will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus, such that the instructions, which execute via the processor of the computer or other programmable data processing apparatus, create means for implementing the functions specific in the flowchart block or blocks.

These computer program instructions may also be stored in a computer usable or computer-readable medium that can direct a computer or other programmable data processing apparatus to function in a particular manner, such that the instructions stored in the computer usable or computer-readable memory produce an article of manufacture including instruction means that implement the function specific in the flowchart block or blocks. The computer-readable medium may include, but is not limited to, magnetic, optical and solid-state data storage devices.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specific in the flowchart block or blocks.

And each block of the flowchart illustrations may represent a module, segment, or portion of code, which includes one or more executable instructions for implementing the specific logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The term 'module', as used herein refers to a component that performs a certain task(s). A module may, for example, be implemented using a programmable data processor configured to perform the module's task(s) through the execution of software and/or firmware comprising program code configured to cause the programmable data processor to perform the module's task(s) when executed on the programmable data processor. The software and/or firmware may include, for example, object-oriented software components, class components and task components, processes, functions, attributes, procedures, subroutines, segments of program code, drivers, firmware, microcode, data, databases, data structures, tables, arrays, and variables. The functionality of a module may be combined in a single component and/or distributed among multiple components. It will be further appreciated that a module may be implemented by a fixed data processor that is configured to perform the module's task(s), for example, one or more gate arrays or application specific integrated circuits (ASIC) that include circuitry that performs the module's task(s).

FIG. 1 is a block diagram of a data management system 100 using a phase-change random access memory (PRAM) 150 in a block-based input/output device according to some embodiments of the present invention. The data management system 100 includes an application execution module 110, an operating system module 120, a file system module 130, a filter layer module 140, a flash translation layer (FTL) module 170, a PRAM 150, and a flash memory 180.

The application execution module 110 executes an application program in concert with the operating system module 120. The application execution module 110 may be configured, for example, to play motion picture experts group (MPEG) layer 3 (MP3) files, to play moving-image files, to play games, to search content and/or to perform some other type of application.

The operating system module 120 may be a group of programs that manage the file system module 130 and provide an interface between hardware and a user. The operating system module 120 may manage resources such as a processor, a memory, an input/output device and a communication device.

The file system module 130 provides functions supporting reading and writing of files. The file system module 130 may, for example, provide data search and restoration functions and may support a large amount of data. The file system module 130 may reduce a system bottleneck caused by a storage medium having a processing speed that is relatively slow in comparison to that of a processor such as a central processing unit (CPU) and facilitates file processing, thereby enhancing the performance of the entire data management system 100.

The FTL module 170 is configured to map a logical sector address of the file system supported by the file system module 130 to a physical sector address of the flash memory 180. In order to write a specific sector of the flash memory 180, the FTL module 170 searches the flash memory 180 for a vacant region in a currently allocated block or allocates a block which has been less frequently erased and performs a write operation on the vacant region or the allocated block.

The file system module 130 inputs or outputs data in units of blocks, where each block is composed of a plurality of bytes. A block denotes a basic input/output unit of the file system module 130 or the FTL module 170. The size of a block may be, for example, 512 bytes or a multiple of 512 bytes (the size of the block is not limited to a size represented by a number such as 512 or 128). A data block may be used as a different term and denote an input/output unit of data, such as a cluster, a sector or a page.

The filter layer module 140 mediates the write operations of the file system module 130 or the FTL module 170 on the PRAM 150. The filter layer module 140 may perform write operations on the PRAM 150 in units of sub-blocks, which are smaller units than block units. The data size of a sub-block may be relatively smaller than that of a block. Specifically, the data size of a sub-block may be smaller than that of a block by a multiple of the data size of the block. For example, if the data size of a block is 1024 bytes, that of a sub-block may be 512 bytes, 256 bytes, . . . , or 1 byte. If data input/output is controlled in units of bytes, the byte units may be sub-block units.

The file system module 130, which supports block-based input/output, generally performs write operations on the flash memory 180 in units of blocks. If part of data in a block is changed, the entire block is rewritten. However, for the PRAM 150, which has a slower write speed than read speed, if an entire block is rewritten, the speed of the entire data management system 100 may significantly drop.

In some embodiments of the present invention, the file system module 130, which performs input/output in units of blocks, controls the filter layer module 140 to write only changed data to the PRAM 150. Specifically, the filter layer module 140 may receive a command from the file system module 130 or the FTL module 170 to perform a write operation on a specific block of the PRAM 150 and may perform a write operation only on changed portions of the block of the PRAM 150, in units of sub-blocks.

The filter layer module 140 acts as a type of filtering layer. When the filter layer module 140 is used, a write operation can be performed on a memory in units of sub-blocks, which are smaller units than block units, without modifying the file system module 130 or the FTL module 170, which perform input/output in units of blocks. The filter layer module 140 filters a block in response to a command to perform a write operation on the block from the file system module 130 or the FTL module 170 and then performs the write operation on the block in units of sub-blocks.

The PRAM 150 is also referred to as a phase-change memory, a state-change memory, or a phase-transition memory. The PRAM 150 has advantages of both flash memories, which do not lose information stored therein even with the power turned off, and dynamic random access memories (DRAMs), which have high processing speed. However, because its write operation may be relatively slower than its read operation, the PRAM 150 may slow down the entire data management system 100 when performing the write operation.

The flash memory 180 is a nonvolatile memory that does not lose its stored information even when the power is turned off. Data can be input or output to/from the flash memory 180 in units of blocks through the FTL module 170. Thus, a large amount of data may be read and written from/to the flash memory 180.

Figure 2:
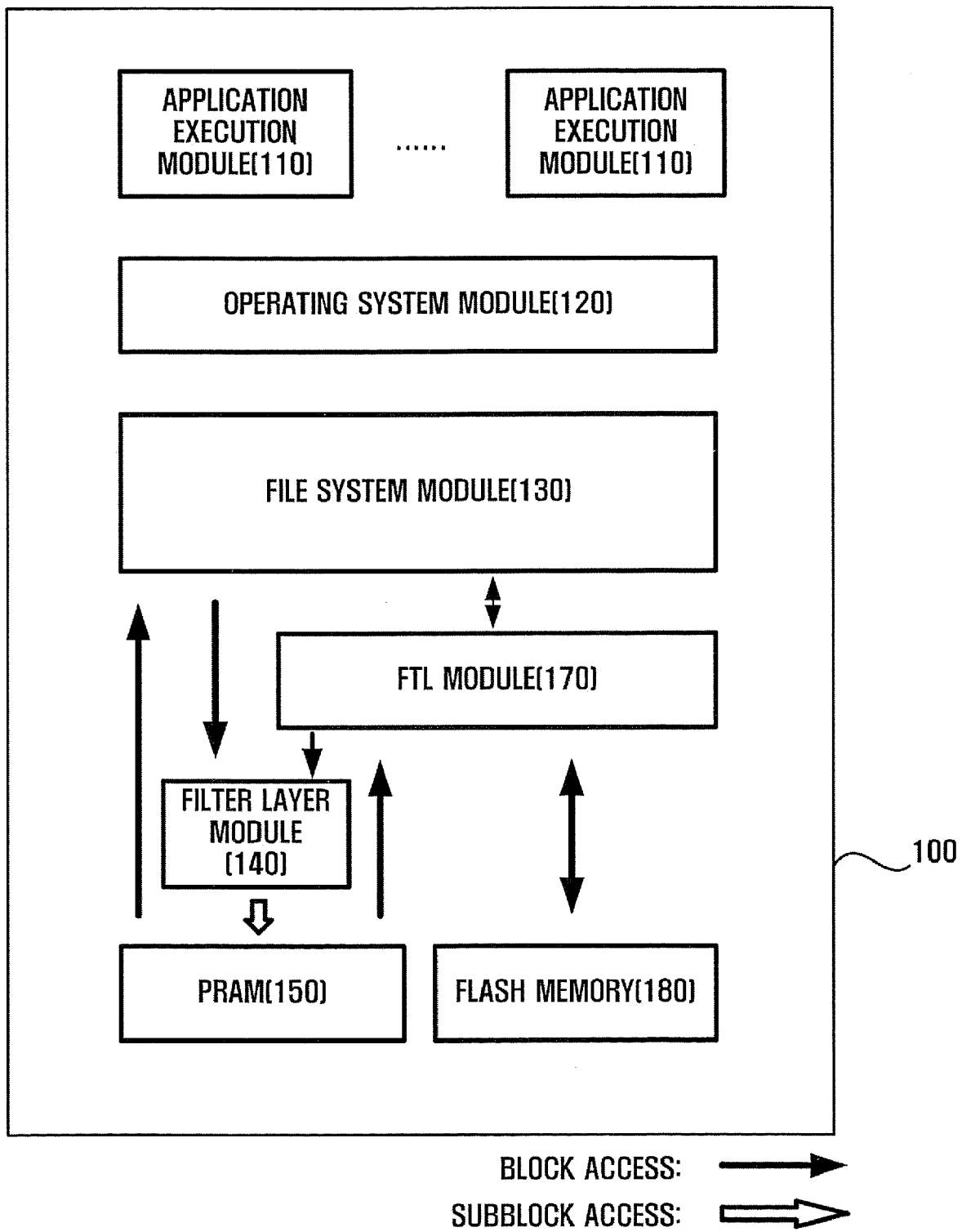
FIG. 2 illustrates operations of the data management system shown in FIG. 1 according to some embodiments of the present invention.

FIG. 2 illustrates operations of the data management system 100 shown in FIG. 1. Attempts may be made to access data stored in the PRAM 150 or the flash memory 180 by the application execution module 110 or the operating system module 120. It may be assumed that user data is stored in the flash memory 180 and that metadata of the file system module 130 and/or the FTL module 170 is stored in the PRAM 150. The metadata of the file system module 130 provides information regarding a user data file, and the metadata of the FTL module 170 provides mapping information between a logical address and a physical address and state information of a physical device. The metadata typically is smaller than the user data and can be frequently modified.

The file system module 130 reads or writes the user data from/to the flash memory 180 in units of blocks. Hereinafter, the user data will be referred to as "first data." The FTL module 170 searches for a physical sector address of the flash memory 180 to which a logical sector address of the file system module 130 is mapped and performs the write or read operation on a specific sector of the flash memory 180 in units of blocks.

The file system module 130 or the FTL module 170 accesses the PRAM 150 in units of blocks in order to read data stored in the PRAM 150. Therefore, the file system module 130 or the FTL module 170, which perform input/output in units of blocks, can be used without modification.

However, data is written to the PRAM 150 in units of sub-blocks. Since the file system module 130 and the FTL module 170 do not support sub-block-based input/output, the filter layer module 140 is used to write data to the PRAM 150 in units of sub-blocks.

In order to write data to a specific block of the PRAM 150, the file system module 130 or the FTL module 170 transmits information, such as an address of a logical block to which the data is to be written, the number of logical blocks, and the data, to the filter layer module 140. Hereinafter, data that is to be written to a specific block of the PRAM 150 will be referred to as "second data." The second data is arranged in units of blocks. That is, the second data is composed of one or more blocks.

The filter layer module 140 searches for a block of the PRAM 150 corresponding to a logical block of the file system module 130 or the FTL module 170 based on mapping information. The block of the PRAM 150 denotes a physical medium in which data is substantially stored.

The filter layer module 140 reads the found block of the PRAM 150. Hereinafter, the data read from the found block of the PRAM 150 will be referred to as "third data." The third data includes an equal number of blocks to the number of blocks of the second data. Therefore, the third data is the same size as the second data. The third data may be temporarily stored in a buffer module (not shown) of the filter layer module 140.

The filter layer module 140 detects changed data by comparing the second and third data. The changed data refers to the difference between the second data and the third data. If the second data is completely different from the third data, the second data is the changed data. If the first half of the blocks of the second data is identical to that of the blocks of the third data, the second half of the blocks of the second data is the changed data. The changed data is composed of one or more sub-blocks.

The filter layer module 140 writes the detected changed data to the block of the PRAM. In this case, while the file system module 130 or the FTL module 170 commands the filter layer module 140 to write the second data to the PRAM 150 in units of blocks, the filter layer module 140 writes the changed data to the block of the PRAM 150 in units of sub-blocks. Therefore, while the write operation is performed on the PRAM 150 in units of blocks externally, it is performed in units of sub-blocks internally. Since data is written only to a changed portion of the PRAM 150, data can be efficiently updated. In addition, data can be read or written from/to the PRAM 150 without modifying the file system module 130 and/or the FTL module 170, which perform block-based input/output.

As described above, data can be input or output to/from the flash memory 180 in units of blocks. Externally, data can be input or output to/from the PRAM 150 in units of blocks. However, internally, data can be written to the PRAM 150 in units of sub-blocks. That is, the user data, which is large and rarely modified, is stored in the flash memory 180, and file metadata, which is small and frequently modified, is stored in the PRAM 150. In so doing, data can be managed efficiently.

In addition, the filter layer module 140 is used to input or output data to/from the PRAM 150 in units of sub-blocks. Therefore, data can be read or written from/to the PRAM 150 without modifying the file system module 130 and/or the FTL module 170, which perform block-based input/output.

The write operation of the PRAM 150 may be slower than the read operation thereof, and the PRAM 150 can write data in units of sub-blocks (for example, in units of bytes) instead of blocks. Using these characteristics of the PRAM 150, data may be extracted from a changed portion of the PRAM 150, and new data may be written to the changed portion of the PRAM 150 in units of sub-blocks. In this way, the flash memory 180 and the PRAM 150 can be effectively used together.

Figure 3:
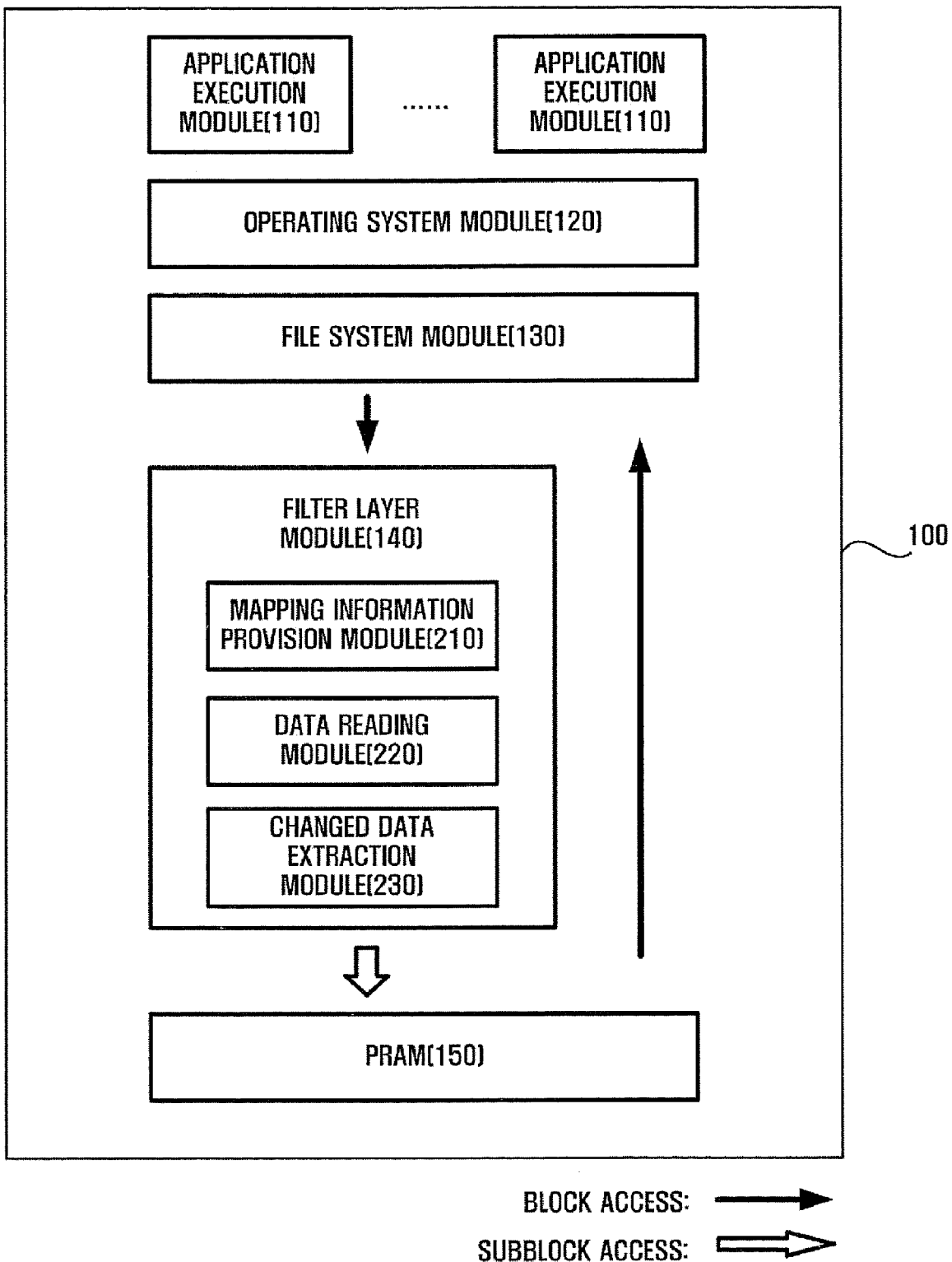
FIG. 3 is a block diagram of a data management system using a PRAM in a block-based input/output device according to additional embodiments of the present invention.
Figure 4:
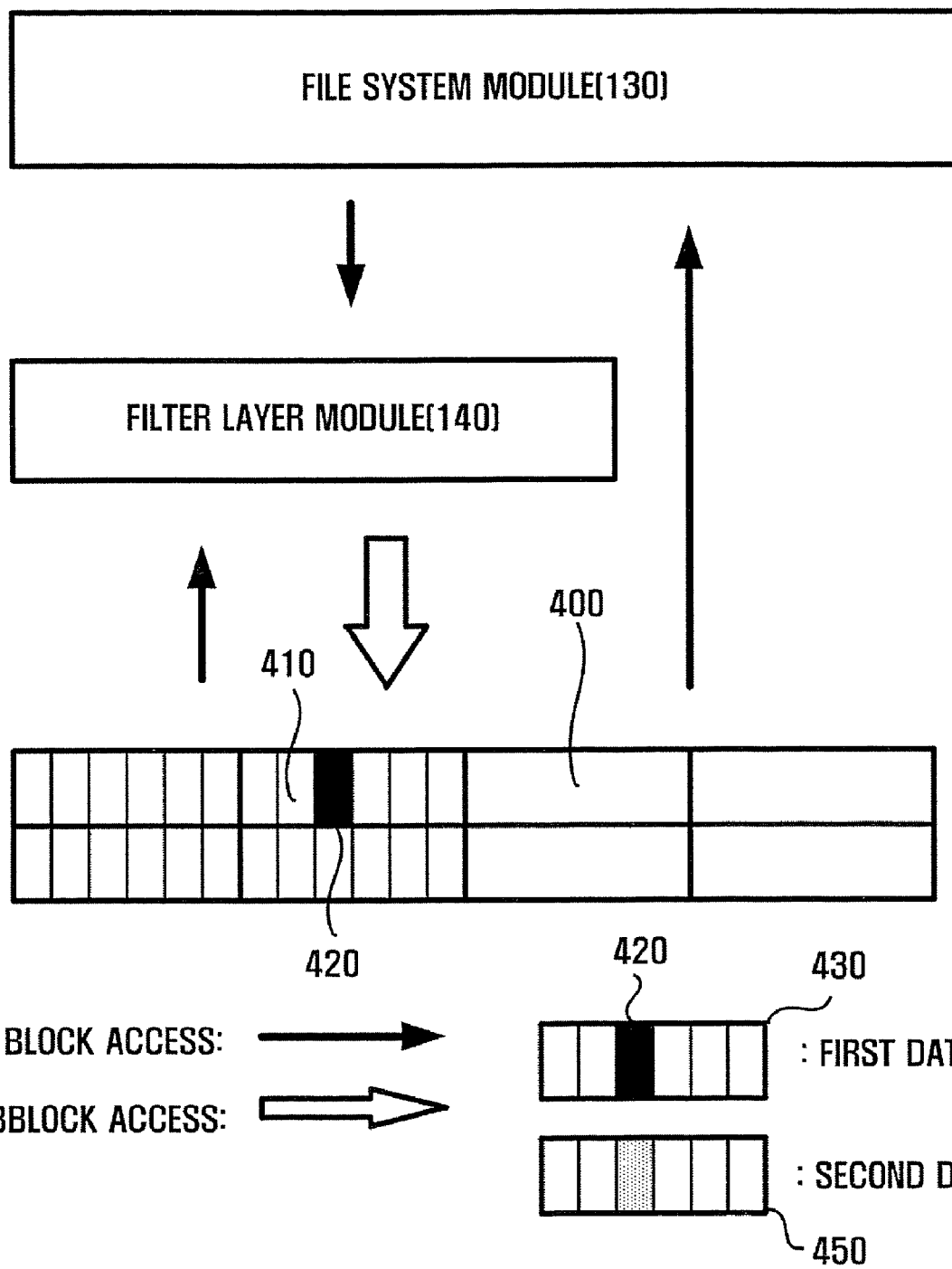
FIG. 4 illustrates operations of the data management system shown in FIG. 3 according to some embodiments of the present invention.

FIG. 3 is a block diagram of a data management system 100 using a PRAM 150 in a block-based input/output device according to additional embodiments of the present invention. FIG. 4 illustrates operations of the data management system 100 shown in FIG. 3.

Referring to FIG. 3, the data management system 100 includes one or more application execution modules 110, an operating system module 120, a file system module 130, a filter layer module 140, and the PRAM 150.

Since the application execution module 110, the operating system module 120, the file system module 130, the filter layer module 140 and the PRAM 150 have been described above, further detailed descriptions thereof will be omitted. The filter layer module 140 includes a mapping information provision module 210, a data-reading module 220, and a changed data extraction module 230.

The mapping information provision module 210 provides mapping information between a logical block of the file system module 130 and a block of the PRAM 150. That is, the mapping information provision module 210 provides mapping information indicating a physical block of the PRAM 150 that corresponds to a logical block of the file system module 130. Specifically, if the file system module 130 issues a command to record first data on a specific logical block, the mapping information provision module 210 searches for a corresponding block of the PRAM 150. In this case, the "first data" is composed of one or more blocks by the file system module 130, which manages block-based input/output. If the first data, which is to be written to the PRAM 150, is smaller than a block of the PRAM 150, it is written to the block. If the first data, which is to be written to the PRAM 150, is larger than a block of the PRAM 150, it is written to two blocks. The mapping information provision module 210 may be included in the file system module 130 or another component or may be implemented as an independent component.

The data-reading module 220 reads the found block of the PRAM 150. In this case, the data-reading module 220 may read the found block of the PRAM 150 in units of sub-blocks. For example, if sub-block units are byte units, the data-reading module 220 may read the found block of the PRAM 150 in units of bytes and temporarily store data of the read block in a buffer module (not shown). The data read by the data-reading module 220 will hereinafter be referred to as "second data."

The changed data extraction module 230 extracts changed data by comparing the first data and the second data. The changed data refers to the difference between the first data and the second data. If the first data is completely different from the second data, the first data is the changed data. If the first half of the blocks of the first data is identical to that of the blocks of the second data, the second half of the blocks of the first data is the changed data. The changed data is composed of one or more sub-blocks.

If the extracted changed data is smaller than the block of the PRAM 150, a portion of the block of the PRAM 150 corresponding to the changed data may be rewritten instead of rewriting the entire block. Consequently, the overhead of the block-based input/output device can be sharply reduced, and the writing speed can be increased. If the writing speed is lower than the reading speed, as can be experienced in PRAMs, the frequency of the write operation may be reduced. In so doing, data can be efficiently written in units of blocks.

Referring to FIG. 4, the operation of the data management system 100 according to the present embodiment is as follows.

The file system module 130 receives a command from the operating system module 120 or the application execution module 110 to store first data 430 in a memory. Then, the file system module 130 transmits information, such as an address of a logical block that will store the first data 430, the number of logical blocks, and the first data 430, to the filter layer module 140.

The filter layer module 140 searches for a block 400 of the PRAM 150 corresponding to the logical block of the file system module 130. The block 400 of the PRAM 150 is composed of a plurality of sub-blocks 410. The filter layer module 140 reads the found block 400 of the PRAM 150 and temporarily stores data read from the found block 400 as second data 450. Then, the filter layer module 140 extracts changed data 420 by comparing the first data 430 and the second data 450. Finally, the filter layer module 140 instructs the PRAM 150 to write the extracted changed data 420 in units of sub-blocks.

If the changed data 420 corresponds to one of the sub-blocks 410, only the sub-block may be written, which produces the effect of writing the first data 430 to the PRAM 150. Therefore, whenever there are minor and frequent changes in data, the data can be effectively updated.

Metadata including information regarding user data or metadata including information regarding data stored in a flash memory is relatively small but may be changed relatively frequently. This is because metadata may include variable information, such as the storage time and latest access time of user data and mapping information of an FTL, as well as unique information of the user data, such as the size and attributes of the user data.

Frequent changes in metadata, for which write requests are made in small units, may impose excessive overhead on a block-based input/output device. In addition, whenever there is a minor change in a block of data, if the entire block is rewritten since data input/output is performed in units of blocks, the system resources may be wasted.

However, according to the some embodiments of the present invention, while block-based input/output is performed externally, data can be written to the PRAM 150 in units of sub-blocks internally without modifying the file system module 130, which performs block-based input/output.

In addition, since a portion of a block of the PRAM 150 corresponding to changed data is rewritten, there is no need to rewrite the entire block, and the time required to record data can be reduced.

Meanwhile, data can be read from the PRAM 150 in units of blocks without using the filter layer module 140.

Figure 5:
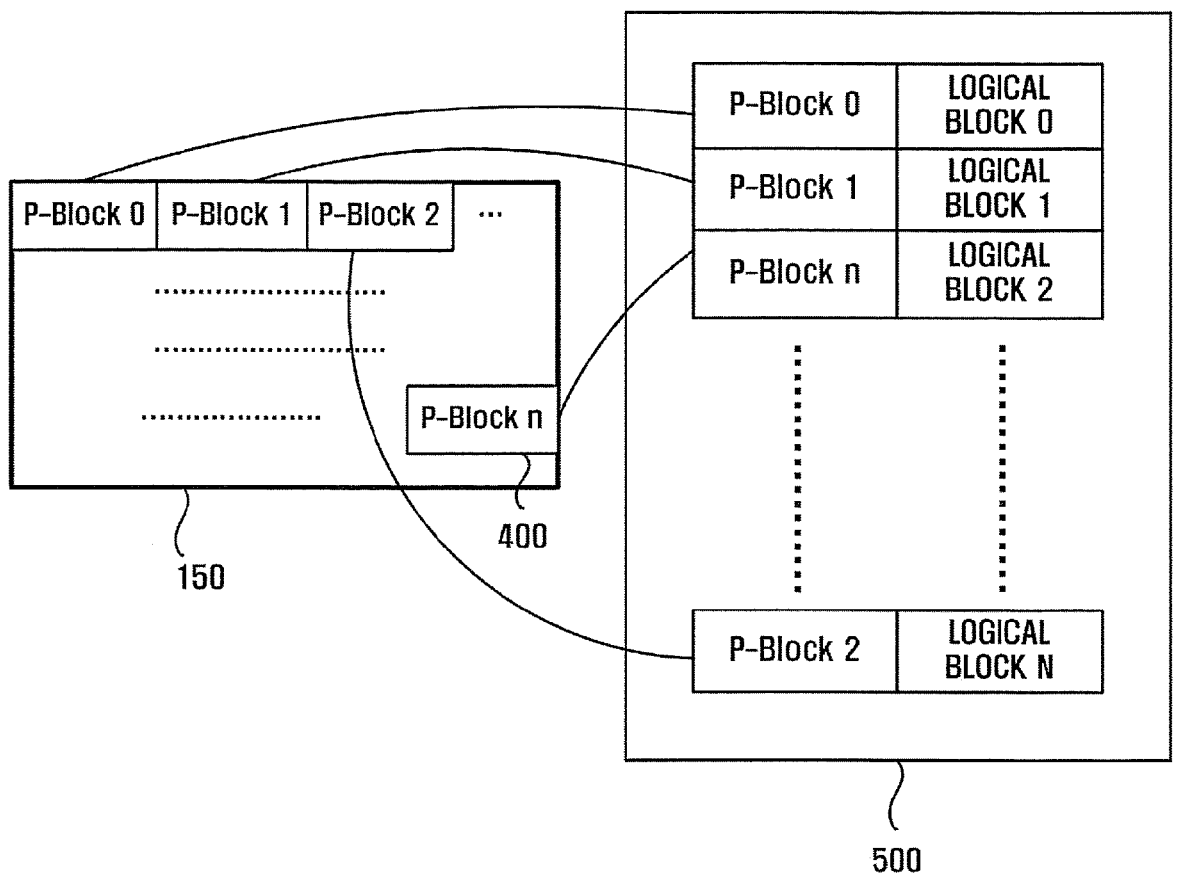
FIG. 5 illustrates a PRAM and a mapping table in a data management system in a block-based input/output device according to further embodiments of the present invention.

FIG. 5 illustrates the structure of a PRAM 150 and a mapping table 500 in a data management system using the PRAM 150 in a block-based input/output device according to some embodiments of the present invention.

Referring to FIG. 5, the PRAM 150 is formatted and thus initialized in block units that are input/output units identical to those of the file system module 130 or the FTL module 170. The PRAM 150 is physically initialized as a plurality of blocks. For example, the PRAM 150 may be composed of zeroth through $n^{th}$ blocks P-Block 0 through P-Block n.

Each block 400 of the PRAM 150 may be accessed using the mapping table 500. The mapping table 500 is created by the mapping information provision module 210 and provides an address of each block 400 of the PRAM 150 corresponding to each logical block of the file system module 130 or the FTL module 170. The mapping information provision module 210 provides mapping information to the file system module 130, the FTL module 170 or the filter layer module 140 using the mapping table 500, and the file system module 130, the FTL module 170 or the filter layer module 140 can access each block 400 of the PRAM 150 based on the mapping information.

Figure 6:
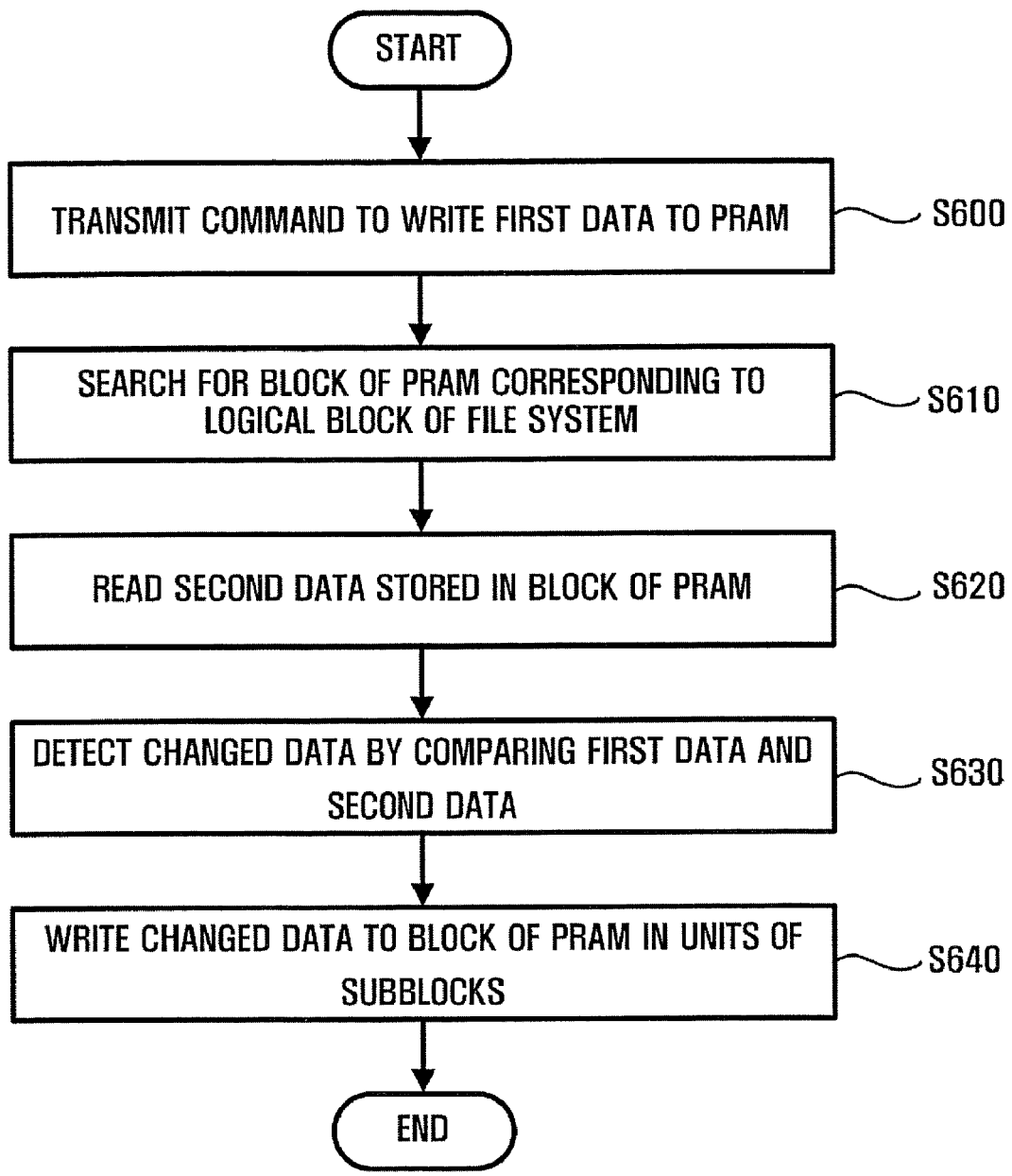
FIG. 6 is a flowchart illustrating data management operations using a PRAM in a block-based input/output device according to some embodiments of the present invention.

FIG. 6 is a flowchart illustrating data management operations using a PRAM in a block-based input/output device according to some embodiments of the present invention. The operating system module 120 or the application execution module 110 transmits a command to write first data to the PRAM 150 to the file system module 130 or the FTL module 170. The first data is composed of one or more blocks to be updated. The file system module 130 or the FTL module 170 delivers the command to the filter layer module 140 (operation S600). The file system module 130 or the FTL module 170 transmits an address of a logical block to which the first data is to be written and the first data to the filter layer module 140, together with the command. The file system module 130, the FTL module 170 or the filter layer module 140 searches for a block of the PRAM 150 corresponding to the logical block based on mapping information (operation S610).

After the block 400 of the PRAM 150 is found using the mapping information, second data stored in the block 400 of the PRAM 150 is read. In this case, the first data is the same size as the second data. Therefore, the first data and the second data have an equal number of blocks and can be compared on a one-to-one basis.

After the second data is read, changed data is detected by comparing the first data and the second data (operation S630). The detected changed data 420 is composed of one or more sub-blocks. The changed data 420 is obtained after the difference between the second data stored in the PRAM 150 and the first data is extracted in units of sub-blocks.

After the changed data 420 is detected, it is written to the block 400 of the PRAM 150, in which the second data is stored, in units of sub-blocks (operation S640). It may be assumed that a sub-block unit is a byte unit and that a block unit is 1024 bytes. In this case, if 10 bytes of the first data are different from the second data, the extracted changed data 420 is 10 bytes. Therefore, not all of 1024 bytes are written to the PRAM 150, but only 10 bytes, i.e., the changed data 420, are written to the PRAM 150. Therefore, the writing speed can be increased.

As described above, if data is small but frequently changed, only changed portions of the data can be rewritten. Hence, the characteristics of PRAMs, that is, a slower writing speed than a reading speed, can be efficiently utilized.

In addition, since the PRAM 150 is written in units of sub-blocks without modifying the file system module 130 or the FTL module 170 of the block-based input/output device, data can be effectively updated.

FIG. 7 is a flowchart illustrating data management operations using a PRAM in a block-based input/output device according to further embodiments of the present invention. The file system module 130 or the FTL module 170 receives a command from the operating system module 120 or the application execution module 110 to read data from the PRAM 150. The file system module 130 or the FTL module 170 also receives information regarding an address of a logical block to be read and the number of logical blocks to be read and transmits a read request to the filter layer module 140 (operation S700).

The filter layer module 140 searches for a block of the PRAM 150, which corresponds to the logical block that is to be read, using mapping information (operation S710). In this case, the filter layer module 140 may request the mapping information provision module 210 to search for the block 400 of the PRAM 150.

After the block 400 of the PRAM 150 is found, data stored in the block 400 of the PRAM 150 is read (operation S720). Here, the block 400 of the PRAM 150 is read to the end in units of sub-blocks.

As described above, data of the PRAM 150 is read using the filter layer module 140, and changed data is extracted by comparing the read data to data that is to be written. Considering that the reading speed of the PRAM 150 is faster than the writing speed thereof, only a changed portion of a block of the PRAM 150 is be written instead of writing the entire block. Therefore, the data of the PRAM 150 can be quickly accessed using the filter layer module 140.

The foregoing is illustrative of the present invention and is not to be construed as limiting thereof. Although a few embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A data management system comprising a data processor configured to provide:
  a file system module configured to transfer file user data and file metadata that describes the file user data in block units;
  a flash translation layer (FTL) module configured to receive the file user data from the file system module and to store the file user data in a logical block of a flash memory; and
  a filter layer module configured to receive the file metadata from the file system module, to retrieve at least one block from a phase change random access memory (PRAM) corresponding to the logical block of the flash memory to which the file user data is stored, to compare the retrieved at least one block to at least one block of the file metadata received from the file system module to identify changed file metadata in the received at least one block and to store the identified changed file metadata in the block of the PRAM in sub-block units, wherein retrieving of the at least one block from the PRAM is performed in block units.

2. The system of claim 1, wherein the sub-block units are byte units.

3. The system of claim 1, further comprising the PRAM and/or the flash memory.

4. A data management system comprising a data processor configured to provide:
  a file system module configured to transfer user file metadata that describes file user data in a file in block units; and
  a filter layer module configured to receive a block of data including the user file metadata from the file system module, to retrieve at least one block from a PRAM corresponding to a logical block of flash memory to which the file user data is stored, to identify changed file metadata in the received block by comparison to file metadata stored in the retrieved at least one block of the PRAM and to store the identified changed file metadata in the PRAM in sub-block units, wherein retrieving of the at the least one block from the PRAM is performed in block units.

5. The system of claim 4, wherein the sub-block units are byte units.

6. The system of claim 4, wherein the filter layer module is configured to format the PRAM in block units.

7. A data management method comprising the following operations performed by a data processor:
  receiving from a file system module a block of data including file user data and file metadata that describes the file user data to be written to a logical block defined in a file system;
  storing the file user data in a logical block of a flash memory;
  retrieving at least one block from a PRAM corresponding to the logical block of the flash memory to which the file user data is stored, wherein retrieving of the at least one block from the PRAM is performed in block units;
  comparing the received file metadata to file metadata in the at least one block of file metadata retrieved from the PRAM to identify changed file metadata in the received block of file metadata; and
  storing the identified changed file metadata in the PRAM in sub-block units.

8. The method of claim 7, wherein the sub-block units are byte units.

9. The method of claim 7, further comprising formatting the PRAM in block units.

10. An article of manufacture comprising a computer-readable medium comprising computer program code embodied therein, the computer program code comprising program code configured to perform the method of claim 7.

11. A data management method comprising the following operations performed by a data processor:
  transferring file user data and file metadata that describes the file user data in block units;
  storing the transferred file user data in a logical block of a flash memory in block units;
  retrieving at least one block from a PRAM corresponding to the logical block of the flash memory to which the file user data is stored, wherein retrieving of the at least one block from the PRAM is performed in block units; and
  comparing the transferred file metadata to file metadata in the retrieved at least one block of the PRAM to identify changed file metadata in the transferred file metadata; and
  storing the identified changed file metadata in the PRAM in sub-block units.

12. An article of manufacture comprising a computer-readable medium comprising computer program code embodied therein, the computer program code comprising program code configured to perform the method of claim 11.

* * * * *